US012439649B2

(12) United States Patent
Miyashita et al.

(10) Patent No.: US 12,439,649 B2
(45) Date of Patent: Oct. 7, 2025

(54) DISLOCATION ENHANCED TRANSISTOR DEVICE AND METHOD

(71) Applicant: Micron Technology, Inc., Boise, ID (US)

(72) Inventors: Toshihiko Miyashita, Boise, ID (US); Jung Chao Chiou, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 626 days.

(21) Appl. No.: 17/720,990

(22) Filed: Apr. 14, 2022

(65) Prior Publication Data

US 2023/0335642 A1      Oct. 19, 2023

(51) Int. Cl.
*H01L 29/10* (2006.01)
*H10B 12/00* (2023.01)
*H10D 30/69* (2025.01)
*H10D 62/17* (2025.01)

(52) U.S. Cl.
CPC ........... *H10D 30/791* (2025.01); *H10B 12/05* (2023.02); *H10B 12/30* (2023.02); *H10D 62/235* (2025.01)

(58) Field of Classification Search
CPC ............... H01L 29/045; H01L 29/1033; H01L 29/7833; H01L 29/7842; H01L 29/7847
See application file for complete search history.

(56) References Cited

U.S. PATENT DOCUMENTS

| 7,691,714 | B2* | 4/2010 | Rotondaro | H10D 84/038 438/301 |
| 11,894,379 | B2* | 2/2024 | Yang | H10D 30/031 |
| 2010/0148270 | A1* | 6/2010 | Golonzka | H10D 84/0167 257/E29.255 |
| 2012/0184075 | A1* | 7/2012 | Domenicucci | H01L 21/26586 438/166 |
| 2014/0346576 | A1* | 11/2014 | Lu | H10D 30/0275 438/297 |
| 2016/0204256 | A1* | 7/2016 | Jackson | H10D 30/751 438/285 |
| 2020/0227554 | A1* | 7/2020 | Yang | H10D 62/021 |
| 2023/0064376 | A1* | 3/2023 | Ho | H10D 62/40 |

* cited by examiner

*Primary Examiner* — Jaehwan Oh
(74) *Attorney, Agent, or Firm* — Schwegman Lundberg & Woessner, P.A.

(57) ABSTRACT

Apparatus and methods are disclosed, including memory devices and systems. Example memory devices, systems and methods include transistors formed in a (100) surface of a semiconductor substrate wherein a channel is oriented in a <100> direction. The transistors further include one or more strain induced dislocations adjacent to a channel.

16 Claims, 6 Drawing Sheets

DISLOCATION ENHANCED TRANSISTOR DEVICE AND METHOD

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface).

The present description relates generally to example structures and methods for improved electrical properties in transistor channels.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
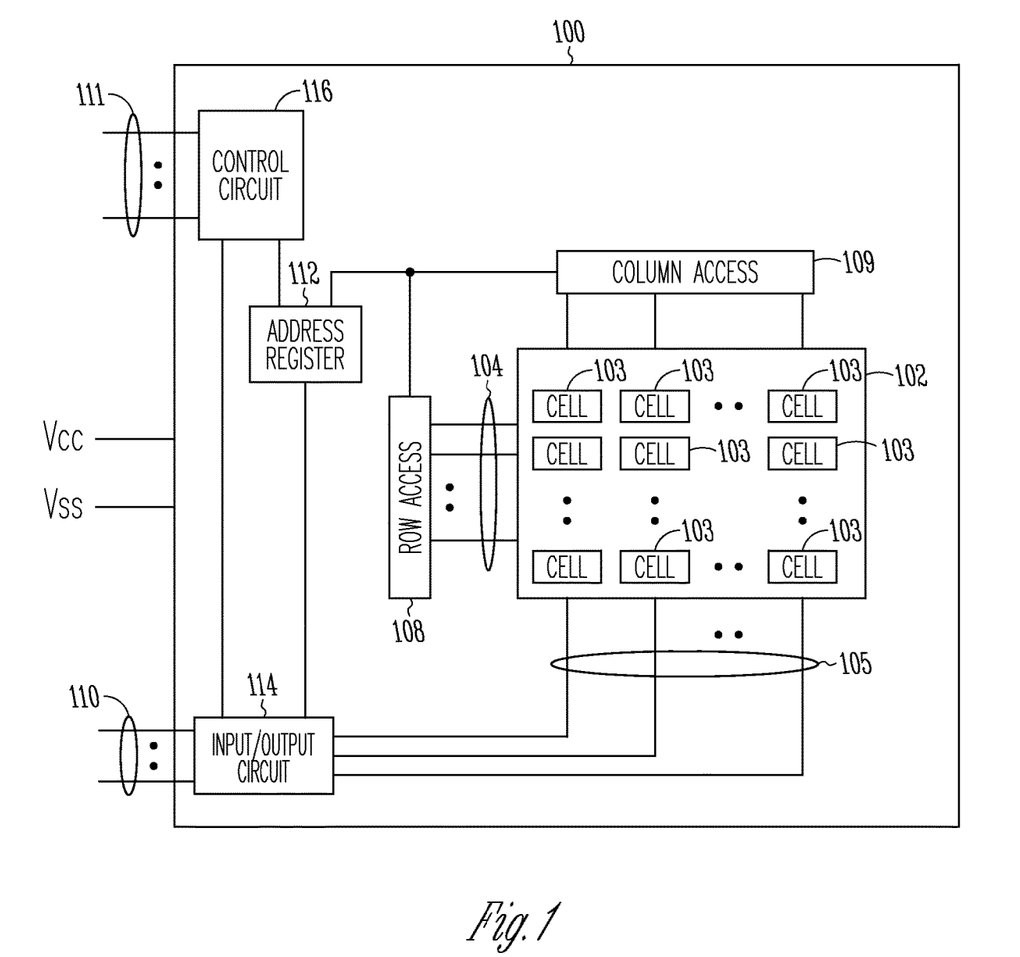
FIG. 1 illustrates a memory device in accordance with some example embodiments.

FIG. 1 shows a block diagram of an apparatus in the form of a memory device 100, according to an embodiment of the invention. Memory device 100 can include a memory array 102 having memory cells 103 that can be arranged in rows and columns along with lines (e.g., access lines) 104 and lines (e.g., data lines) 105. Memory cells 103 may include transistors and utilize methods as described in more detail in FIGS. 2-5. Memory device 100 can use lines 104 to access memory cells 103 and lines 105 to exchange information with memory cells 103.

Row access 108 and column access 109 circuitry can respond to an address register 112 to access memory cells 103 based on row address and column address signals on lines 110, 111, or both. A data input/output circuit 114 can be configured to exchange information between memory cells 103 and lines 110. Lines 110 and 111 can include nodes within memory device 100 or pins (or solder balls) on a package where memory device 100 can reside.

A control circuit 116 can control operations of memory device 100 based on signals present on lines 110 and 111. A device (e.g., a processor or a memory controller) external to memory device 100 can send different commands (e.g., read, write, or erase commands) to memory device 100 using different combinations of signals on lines 110, 111, or both.

Memory device 100 can respond to commands to perform memory operations on memory cells 103, such as performing a read operation to read information from memory cells 103 or performing a write (e.g., programming) operation to store (e.g., program) information into memory cells 103. Memory device 100 can also perform an erase operation to clear information from some or all of memory cells 103.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00," "01," "10," and "11" of two bits, one of eight possible values "000," "001," "010," "011," "100," "101," "110," and "111" of three bits, or one of other values of another number of multiple bits. A cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive RAM device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100.

One of ordinary skill in the art will recognize that memory device 100 may include other elements, several of which are not shown in FIG. 1, so as not to obscure the example embodiments described herein.

Figure 2:
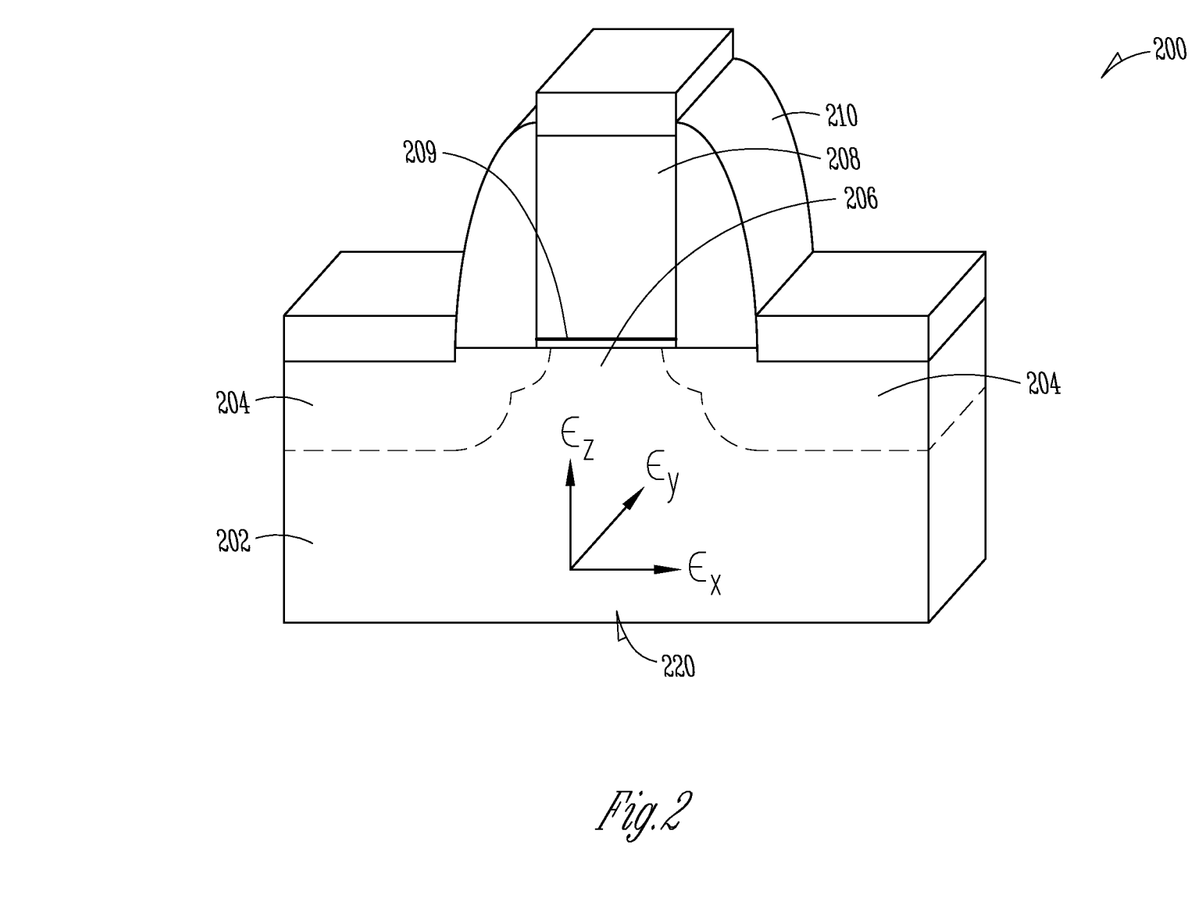
FIG. 2 illustrates a transistor in accordance with some example embodiments.

FIG. 2 shows a transistor 200 according to one example. In one example, transistor 200 is used in one or more memory cells 103 or other circuitry in memory device 100 as shown in FIG. 1. The transistor 200 is formed in a semiconductor substrate 202, and includes source/drain regions 204 separated by a channel 206. A gate dielectric 209 is located over the channel 206, and a gate 208 is located over the gate dielectric 209. Orientation arrow directions 220 indicate directional axes that are used to describe strain directions within the channel 206 and/or adjacent to the channel 206. In one example, strain in one or more of the directions 220 leads to dislocations adjacent to the channel 206 that enhance conduction within the channel 206.

One of ordinary skill in the art, having the benefit of the present disclosure, will recognize that strain can be induced in channel 206 by a number of different mechanisms. One mechanism includes recrystallization of an amorphized region while an external stress is applied. Beyond a certain threshold of strain, the strain is accommodated by formation of dislocations within the crystalline substrate 202. Dislocations can be described as regular interruptions in a crystalline lattice of the substrate 202. In one example, the dislocations facilitate improved electrical properties adjacent to and within the dislocations. One of ordinary skill in the art, having the benefit of the present disclosure, will recognize that an amount of strain necessary to create dislocations and/or vary electrical properties is highly dependent on orientation of channels and orientation of the crystalline lattice of the substrate 202. An amount of strain necessary to create dislocations and/or vary electrical properties is also different between N-type semiconductor doping regions and P-type semiconductor doping regions.

A semiconductor substrate surface can be described using a crystallographic plane notation (xxx) and a crystallographic direction <xxx> within the plane. One of ordinary skill in the art, having the benefit of the present disclosure, will recognize that a notation of <xxx>/(xxx) describes both a crystallographic plane of a substrate surface, and a direction of transistor channels formed in the substrate surface. A transistor formed along a crystallographic direction <xxx> will conduct from a first source/drain region, through a channel, and into a second source/drain region along the noted crystallographic direction <xxx>.

PMOS hole mobility is higher for devices with orientations of <100>/(100) compared to <110>/(100). NMOS electron mobility is similar for devices with orientations of <100>/(100) and <110>/(100). Although, NMOS strain sensitivity to electron mobility is higher for devices with orientations of <110>/(100), <100>/(100) channel is preferable from device performance perspectives if much higher level channel strain is induced. By using a higher level of strain than is used in devices with orientations of <110>/(100), and using an orientation of <100>/(100), both PMOS devices and NMOS devices are enhanced at the same time.

In one example, Dislocation Stress Memorization Technique (DSMT) is used to provide strain in device channels at a level that creates dislocations and enhances electron mobility. Although DSMT is discussed as an example, the invention is not so limited. Other mechanisms of dislocation formation are also within the scope of the invention. Advantages of DSMT include, but are not limited to, ease of manufacture, an ability to tailor strain direction, and an amount of strain that is possible with the technique.

Figure 3A:
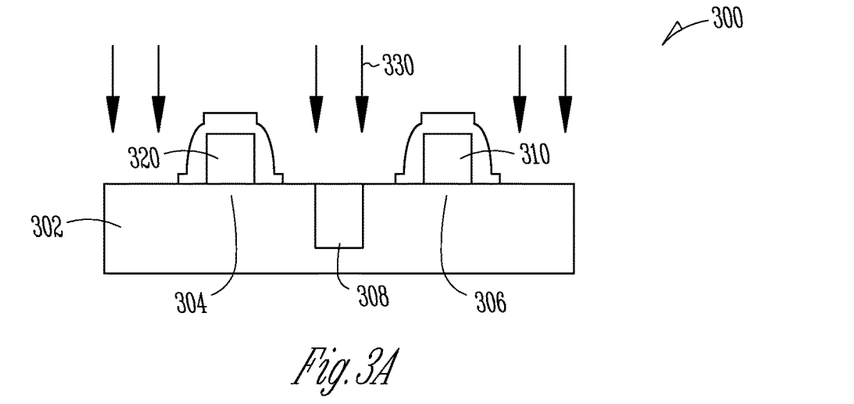
FIG. 3A-3C illustrate selected manufacturing stages of transistors in accordance with some example embodiments.
Figure 3B:
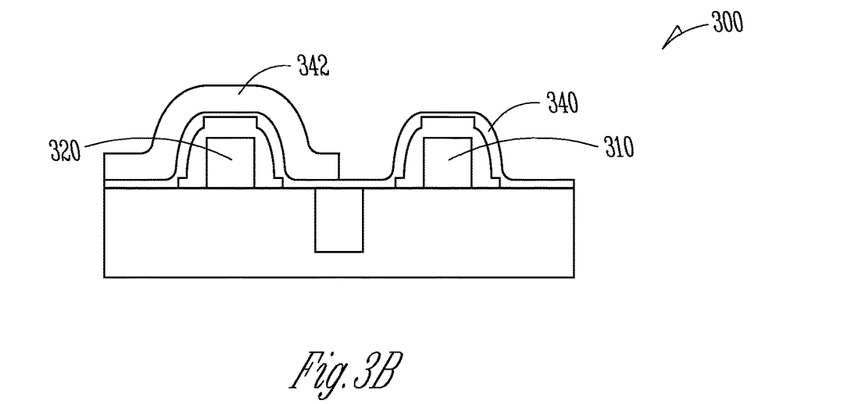
Figure 3C:
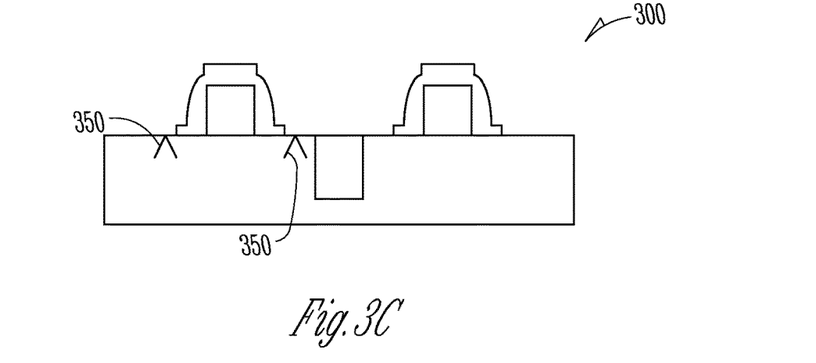

FIGS. 3A-3C show selected stages of manufacture using DSMT to form an electronic device such as a memory device. In FIG. 3A, an electronic device 300 is shown including an N-type channel 304 and a P-type channel 306 formed within a semiconductor substrate 302. In the example shown, an isolation structure 308 is included to electrically separate the N-type channel 304 from the P-type channel 306. A first gate 310 is formed over the P-type channel 306 and a second gate 320 is formed over the N-type channel 304. An implant operation is performed, as indicated by arrows 330. In one example, the implant includes dopant elements to form source/drain regions of transistors associated with the N-type channel 304 and the P-type channel 306, and to amorphize source/drain regions at the same time. Dopant elements include, but are not limited to, arsenic, phosphorous, germanium, boron, gallium, etc.

In FIG. 3B, one or more capping layers are formed selectively over the N-type channel 304. Examples of formation processes include, but are not limited to, film deposition, photo lithography patterning, and dry etching processes. In FIG. 3B a first capping layer 340 includes an oxide layer such as silicon oxide, and a second capping layer 342 includes a nitride layer such as silicon nitride. In one example, the capping layer or layers serve to stress the substrate 302 in a region adjacent to the N-type channel 304. The stress provided by the one or more capping layers induces strain at or near the one or more capping layers. In one example, the second capping layer 342 includes a nitride layer having intrinsic tensile stress that imparts a tensile stress to adjacent structures and creates dislocations as a result.

In FIG. 3C, the device 300 is annealed. In one example, the anneal operation serves to activate or otherwise incorporate the dopant elements that were implanted as implant 330 in FIG. 3A into a crystalline structure. In one example, the anneal operation also re-crystallizes the substrate 302 adjacent to the channels 304, 306. Due to the stress provided by the one or more capping layers 340, 342, a strain is induced adjacent to at least N-type channel 304. Dislocations 350 are created adjacent to N-type channel 304 to accommodate the strain. As noted above, the presence of the dislocations 350 adjacent to the N-type channel 304 enhances electrical properties in N-type channel 304. In one example, after the desired dislocations 350 are formed, the one or more capping layers 340, 342 are removed, and the dislocations 350 remain.

Figure 4:
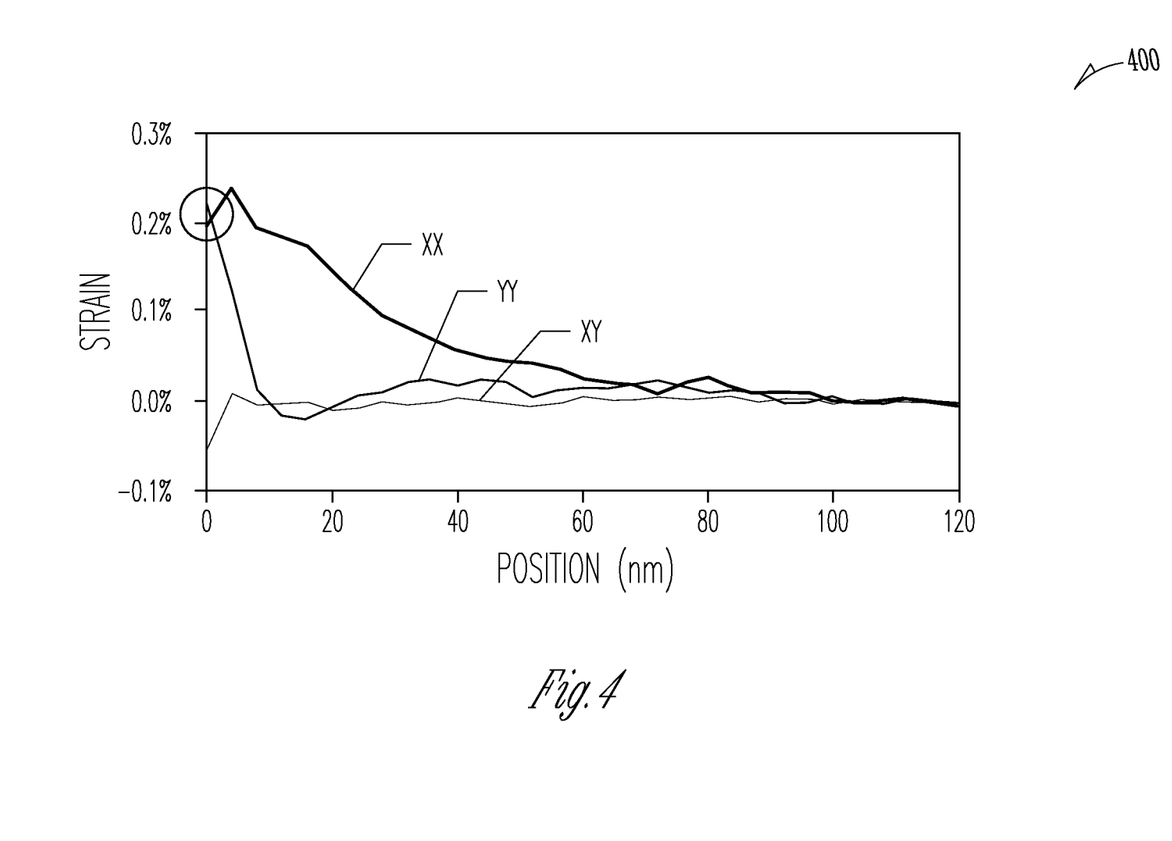
FIG. 4 illustrates channel strain data of a transistor in accordance with some example embodiments.

In one example, strain is tailored to desired directions with respect to channels 304. Different applications of strain can be controlled by a number of techniques, including selecting where the one or more capping layers are applied. FIG. 4 shows a plot 400 of different strains within an N-type channel 304 as measured in an XX direction, a YY direction, and an XY direction. The directions of strain in FIG. 4 correspond to the strain axes 220 noted in FIG. 2. In the example shown in FIG. 4, both an XX direction strain and a YY direction strain are approximately +0.2 percent (positive value means tensile, while negative corresponds to compressive). This induced strain values (both XX and YY)

are higher than those of <110>/(100) channel case by more than twice, which is preferable for N-type channel device current drive improvement even considering the difference of strain sensitivity to electron mobility. In one example, a strain of greater than or equal to 0.2 percent is preferred within the <100>/(100) system to provide enhanced electrical properties in N-type channel transistors. Additionally, P-type channel transistors when oriented in <100>/(100) exhibit enhanced electrical properties over <110>/(100) channels. Therefore, devices with dislocations formed adjacent to channel regions in the <100>/(100) system provide enhanced electrical properties for both N-type channel transistors and P-type channel transistors when compared to transistors in the <110>/(100) system.

Figure 5:
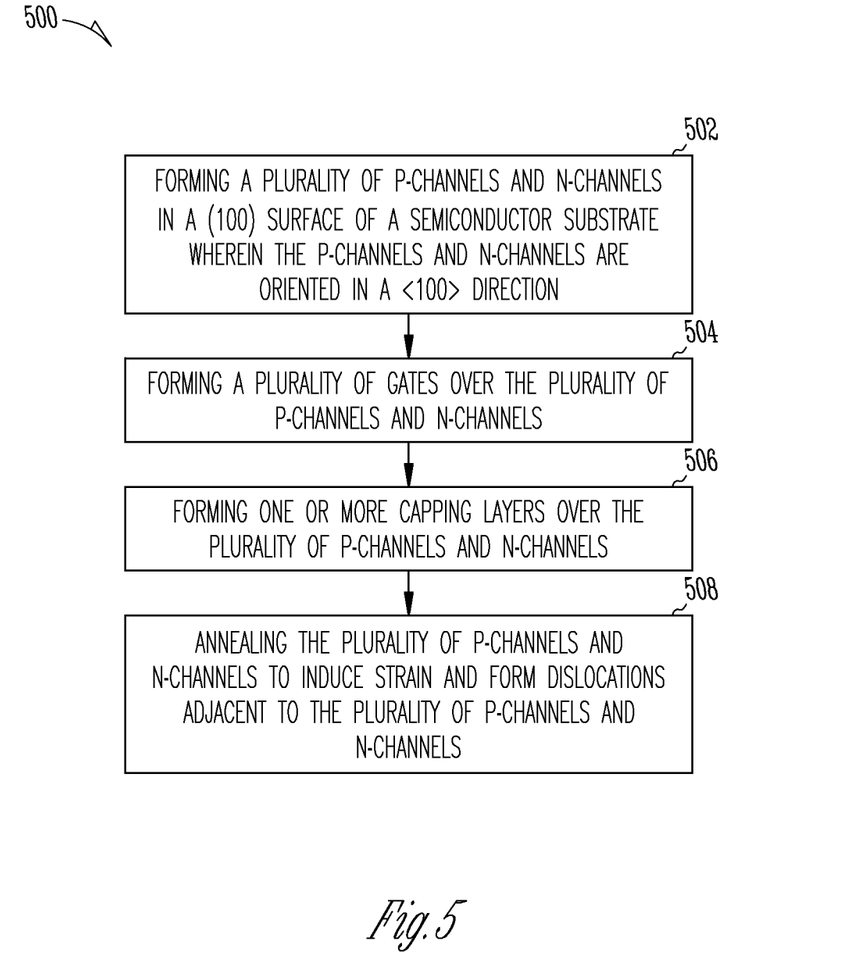
FIG. 5 illustrates an example method flow diagram in accordance with other example embodiments.

FIG. 5 shows a flow diagram of an example method of manufacture. In operation 502, a plurality of P-channels and N-channels are formed in a (100) surface of a semiconductor substrate wherein the P-channels and N-channels are oriented in a <100> direction. In operation 504, a plurality of gates are formed over the plurality of P-channels and N-channels. In operation 506, one or more capping layers are formed over the plurality of N-channels, and in operation 508, the plurality of P-channels and N-channels are annealed to induce strain and form dislocations adjacent to the plurality of P N-channels.

Figure 6:
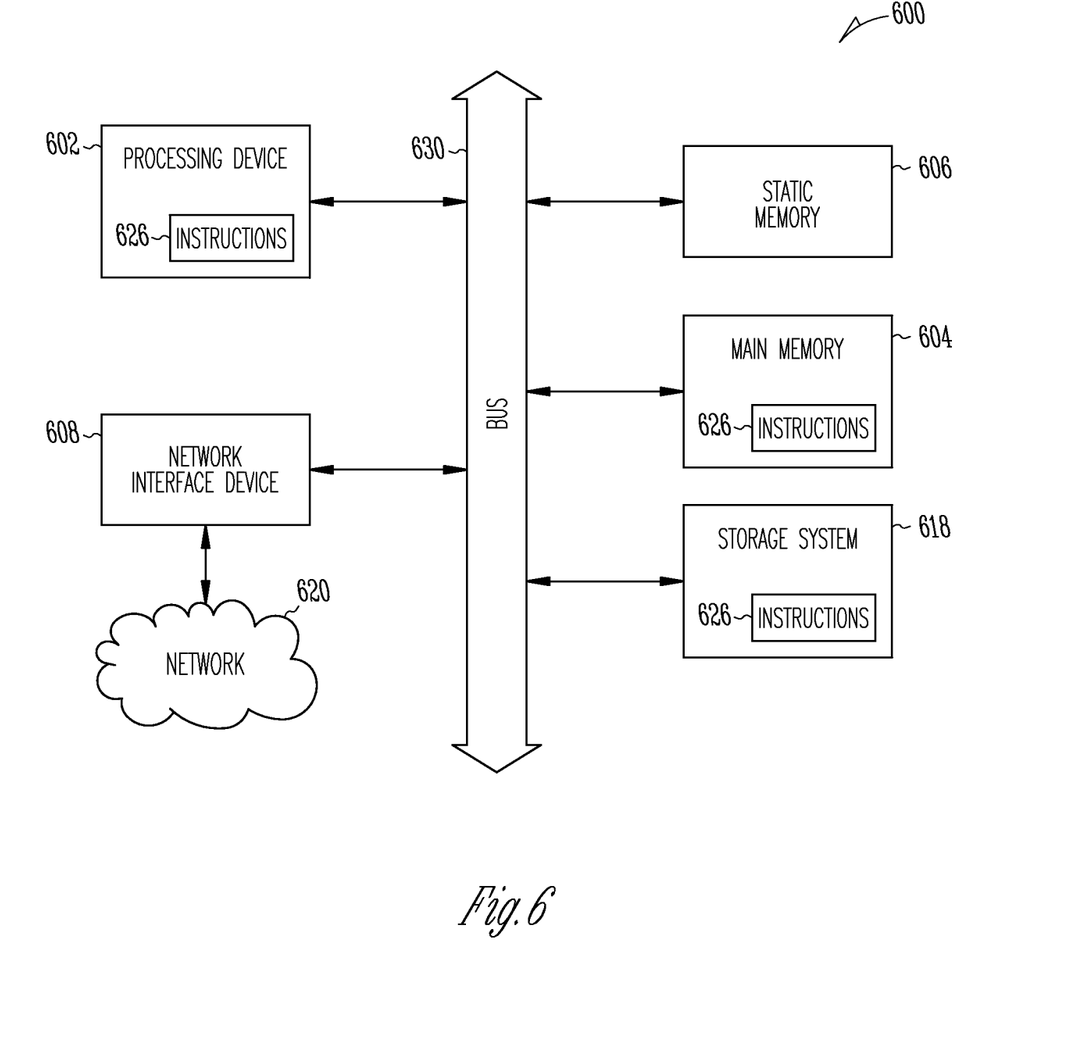
FIG. 6 illustrates an example block diagram of an information handling system in accordance with some example embodiments.

FIG. 6 illustrates a block diagram of an example machine (e.g., a host system) 1600 which may include one or more transistors, memory devices and/or memory systems as described above. As discussed above, machine 600 may benefit from enhanced memory performance from use of one or more of the described memory devices and/or memory systems, facilitating improved performance of machine 600 (as for many such machines or systems, efficient reading and writing of memory can facilitate improved performance of a processor or other components that machine, as described further below.

In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 600 may include a processing device 602 (e.g., a hardware processor, a central processing unit (CPU), a graphics processing unit (GPU), a hardware processor core, or any combination thereof, etc.), a main memory 604 (e.g., read-only memory (ROM), dynamic random-access memory (DRAM) such as synchronous DRAM (SDRAM) or Rambus DRAM (RDRAM), etc.), a static memory 606 (e.g., static random-access memory (SRAM), etc.), and a storage system 618, some or all of which may communicate with each other via a communication interface (e.g., a bus) 630. In one example, the main memory 604 includes one or more memory devices as described in examples above.

The processing device 602 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 can be configured to execute instructions 626 for performing the operations and steps discussed herein. The computer system 600 can further include a network interface device 608 to communicate over a network 620.

The storage system 618 can include a machine-readable storage medium (also known as a computer-readable medium) on which is stored one or more sets of instructions 626 or software embodying any one or more of the methodologies or functions described herein. The instructions 626 can also reside, completely or at least partially, within the main memory 604 or within the processing device 602 during execution thereof by the computer system 600, the main memory 604 and the processing device 602 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with multiple particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 600 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 600 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 626 (e.g., software, programs, an operating system (OS), etc.) or other data are stored on the storage system 618 can be accessed by the main memory 604 for use by the processing device 602. The main memory 604 (e.g., DRAM) is typically fast, but volatile, and thus a different type of storage than the storage system 618 (e.g., an SSD), which is suitable for long-term storage, including while in an "off" condition. The instructions 626 or data in use by a user or the machine 600 are typically loaded in the main memory 604 for use by the processing device 602. When the main memory 604 is full, virtual space from the storage system 618 can be allocated to supplement the main memory 604; however, because the storage system 618 device is typically slower than the main memory 604, and write speeds are typically at least twice as slow as read speeds, use of virtual memory can greatly reduce user experience due to storage system latency (in contrast to the main memory 604, e.g., DRAM). Further, use of the storage system 618 for virtual memory can greatly reduce the usable lifespan of the storage system 618.

The instructions 624 may further be transmitted or received over a network 620 using a transmission medium via the network interface device 608 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.15 family of standards known as Wi-Fi®, IEEE 802.16 family of standards known as WiMax®), IEEE 802.15.4 family of standards, peer-to-peer (P2P) networks, among others. In an example, the network interface device 608 may include one or more physical jacks (e.g., Ethernet, coaxial, or phone jacks) or one or more antennas to connect to the network 620. In an example, the network interface device 608 may include multiple antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on,"

"over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" is used herein to refer generally to any structure on which integrated circuits are formed, and also to such structures during various stages of integrated circuit fabrication. The term "substrate" is used to refer to either a wafer, or other structures which support or connect to other components, such as memory die or portions thereof. Thus, the term "substrate" embraces, for example, circuit or "PC" boards, interposers, and other organic or non-organic supporting structures (which in some cases may also contain active or passive components). The following detailed description is, therefore, not to be taken in a limiting sense, and the scope of the various embodiments is defined only by the appended claims, along with the full scope of equivalents to which such claims are entitled.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

To better illustrate the method and apparatuses disclosed herein, a non-limiting list of embodiments is provided here:

Example 1 is a transistor, comprising a source region and a drain region separated by a channel and formed in a (100) surface of a semiconductor substrate wherein the channel is oriented in a <100> direction. The transistor further includes a gate dielectric over the channel, a gate over the gate dielectric, and one or more strain induced dislocations adjacent to the channel.

In Example 2, the transistor of Example 1 optionally includes wherein the one or more strain induced dislocations are located at edges of the channel.

In Example 3, the transistor of any one of Examples 1-2 optionally further includes one or more cap layers over the gate.

In Example 4, the transistor of any one of Examples 1-3 optionally includes wherein the one or more cap layers include a silicon nitride layer.

In Example 5, the transistor of any one of Examples 1-4 optionally includes wherein the one or more cap layers include a silicon oxide layer adjacent to the gate and a silicon nitride layer over the silicon oxide layer.

In Example 6, the transistor of any one of Examples 1-5 optionally includes wherein a strain within the channel is greater than or equal to 0.2 percent.

In Example 7, the transistor of any one of Examples 1-6 optionally includes wherein a strain within the channel is greater than or equal to 0.2 percent in a direction parallel with the channel.

In Example 8, the transistor of any one of Examples 1-7 optionally includes wherein a strain within the channel is greater than or equal to 0.2 percent in a direction perpendicular to the channel.

In Example 9, the transistor of any one of Examples 1-8 optionally includes wherein the channel is an N-type channel.

Example 10 is a memory device. The memory device includes a plurality of PMOS and NMOS devices formed in a (100) surface of a semiconductor substrate wherein channels of the PMOS and NMOS devices are oriented in a <100> direction. The memory device also includes a number of gate dielectrics over the channels, a number of gates over the gate dielectrics, and one or more strain induced dislocations adjacent to N-channels of the NMOS devices.

In Example 11, the memory device of Example 10 optionally further includes one or more cap layers over the number of gates.

In Example 12, the memory device of any one of Examples 10-11 optionally includes wherein the one or more cap layers include a silicon nitride layer.

In Example 13, the memory device of any one of Examples 10-12 optionally includes wherein the one or more cap layers include a silicon oxide layer adjacent to the gate and a silicon nitride layer over the silicon oxide layer.

In Example 14, the memory device of any one of Examples 10-13 optionally includes wherein a strain within the channel is greater than or equal to 0.2 percent.

In Example 15, the memory device of any one of Examples 10-14 optionally includes wherein a strain within the channel is greater than or equal to 0.2 percent in a direction parallel with the channel.

In Example 16, the memory device of any one of Examples 10-15 optionally includes wherein a strain within the channel is greater than or equal to 0.2 percent in a direction perpendicular to the channel.

Example 17 is a method of forming a semiconductor device. The method includes forming a plurality of P-channels and N-channels in a (100) surface of a semiconductor substrate wherein the P-channels and N-channels are oriented in a <100> direction. The method also includes forming a plurality of gates over the plurality of P-channels and N-channels. The method also includes forming one or more capping layers over the plurality of P-channels and N-channels, and annealing the plurality of P-channels and N-channels to induce strain and form dislocations adjacent to the plurality of P-channels and N-channels.

In Example 18, the method of Example 17 optionally includes wherein annealing the plurality of P-channels and N-channels to induce strain includes annealing to induce a strain of 0.2 percent or greater in channel direction.

In Example 19, the method of any one of Examples 17-18 optionally includes wherein annealing the plurality of P-channels and N-channels to induce strain includes annealing to induce a strain of 0.2 percent or greater perpendicular to the channel direction.

In Example 20, the method of any one of Examples 17-19 optionally further includes implanting source and drain regions prior on either side of the plurality of P-channels and N-channels prior to forming the one or more capping layers.

In Example 21, the method of any one of Examples 17-20 optionally includes wherein annealing further includes annealing the source and drain regions.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A transistor, comprising:
    a source region and a drain region separated by a channel and formed in a (100) surface of a semiconductor substrate wherein the channel is oriented in a <100> direction;
    a gate dielectric over the channel;
    a gate over the gate dielectric;
    one or more strain induced dislocations adjacent to the channel.

2. The transistor of claim 1, wherein the one or more strain induced dislocations are located at edges of the channel.

3. The transistor of claim 1, further including one or more cap layers over the gate.

4. The transistor of claim 3, wherein the one or more cap layers include a silicon nitride layer.

5. The transistor of claim 3, wherein the one or more cap layers include a silicon oxide layer adjacent to the gate and a silicon nitride layer over the silicon oxide layer.

6. The transistor of claim 1, wherein a strain within the channel is greater than or equal to 0.2 percent.

7. The transistor of claim 1, wherein a strain within the channel is greater than or equal to 0.2 percent in a direction parallel with the channel.

8. The transistor of claim 1, wherein a strain within the channel is greater than or equal to 0.2 percent in a direction perpendicular to the channel.

9. The transistor of claim 1, wherein the channel is an N-type channel.

10. A memory device, comprising:
    a plurality of PMOS and NMOS devices formed in a (100) surface of a semiconductor substrate wherein channels of the PMOS and NMOS devices are oriented in a <100> direction;
    a number of gate dielectrics over the channels;
    a number of gates over the gate dielectrics;
    one or more strain induced dislocations adjacent to N-channels of the NMOS devices.

11. The memory device of claim 10, further including one or more cap layers over the number of gates.

12. The memory device of claim 11, wherein the one or more cap layers include a silicon nitride layer.

13. The memory device of claim 11, wherein the one or more cap layers include a silicon oxide layer adjacent to the gate and a silicon nitride layer over the silicon oxide layer.

14. The memory device of claim 10, wherein a strain within the channel is greater than or equal to 0.2 percent.

15. The memory device of claim 10, wherein a strain within the channel is greater than or equal to 0.2 percent in a direction parallel with the channel.

16. The memory device of claim 10, wherein a strain within the channel is greater than or equal to 0.2 percent in a direction perpendicular to the channel.

* * * * *